United States Patent
Cheng

(10) Patent No.: US 12,538,530 B2
(45) Date of Patent: Jan. 27, 2026

(54) SEMICONDUCTOR STRUCTURE AND METHOD FOR PREPARING THE SAME

(71) Applicant: Enkris Semiconductor (Wuxi), Ltd., Wuxi (CN)

(72) Inventor: Kai Cheng, Wuxi (CN)

(73) Assignee: Enkris Semiconductor (Wuxi), Ltd., Wuxi (CN)

(*) Notice: Subject to any disclaimer, the term of this patent is extended or adjusted under 35 U.S.C. 154(b) by 505 days.

(21) Appl. No.: 18/065,835

(22) Filed: Dec. 14, 2022

(65) Prior Publication Data

US 2023/0207617 A1    Jun. 29, 2023

(30) Foreign Application Priority Data

Dec. 23, 2021 (CN) .......................... 202111594707.6

(51) Int. Cl.
| | |
|---|---|
| *H10D 62/10* | (2025.01) |
| *H10D 30/01* | (2025.01) |
| *H10D 30/47* | (2025.01) |
| *H10D 62/815* | (2025.01) |
| *H10D 62/85* | (2025.01) |

(52) U.S. Cl.
CPC ......... *H10D 62/102* (2025.01); *H10D 30/015* (2025.01); *H10D 30/475* (2025.01); *H10D 62/8171* (2025.01); *H10D 62/8503* (2025.01)

(58) Field of Classification Search
None
See application file for complete search history.

(56) References Cited

U.S. PATENT DOCUMENTS

| | | | | |
|---|---|---|---|---|
| 10,186,671 | B2* | 1/2019 | Goto ..................... | H10H 20/821 |
| 2010/0207097 | A1* | 8/2010 | Oh ....................... | H10H 20/818 |
| | | | | 438/46 |
| 2011/0140083 | A1* | 6/2011 | Driscoll ............ | H01L 21/02507 |
| | | | | 257/15 |
| 2011/0272665 | A1* | 11/2011 | Yamaguchi ........ | H10D 30/4755 |
| | | | | 257/E29.074 |
| 2013/0043489 | A1* | 2/2013 | Kotani .............. | H01L 21/02458 |
| | | | | 257/77 |
| 2016/0043275 | A1* | 2/2016 | Ting ................... | H10H 20/8162 |
| | | | | 257/13 |
| 2016/0380155 | A1* | 12/2016 | Jeong ................. | H10H 20/8215 |
| | | | | 257/101 |
| 2017/0062680 | A1* | 3/2017 | Yoo ..................... | H01L 25/0753 |

* cited by examiner

*Primary Examiner* — Khaja Ahmad
(74) *Attorney, Agent, or Firm* — Westbridge IP LLC

(57) ABSTRACT

Disclosed are a semiconductor structure and a method for preparing the same, relating to the field of semiconductor technologies. The semiconductor structure includes: a substrate; and a plurality of functional film layers stacked on the substrate, the plurality of functional film layers include a first semiconductor layer and a second semiconductor layer stacked with each other, the first semiconductor layer is arranged between the substrate and the second semiconductor layer. The first semiconductor layer includes a plurality of defect pits recessed toward the substrate, the defect pits are filled by the second semiconductor layer, and one side of the second semiconductor layer away from the first semiconductor layer is a plane. The semiconductor structure and the preparation method thereof provided in the present application solve the problem of vertical leakage in the semiconductor structure in the prior art.

16 Claims, 4 Drawing Sheets

SEMICONDUCTOR STRUCTURE AND METHOD FOR PREPARING THE SAME

CROSS-REFERENCE TO RELATED APPLICATIONS

The present application claims priority to Chinese Patent Application No. 202111594707.6, filed on Dec. 23, 2021, all contents of which are incorporated herein in its entirety by reference.

TECHNICAL FIELD

The present application relates to the field of semiconductor technologies, in particular, to a semiconductor structure and a method for preparing the same.

BACKGROUND

Among compound semiconductor electronic devices, high electron mobility transistors are widely used in high frequency and high power devices. It relies on the spontaneous polarization and piezoelectric polarization effects of III-V nitride semiconductors to form a two-dimensional electron gas conduction channel with quantum effects at a heterojunction interface. Taking a GaN field effect transistor as an example, its working principle is to achieve a purpose of switching by controlling the two-dimensional electron gas of the channel.

However, since a channel layer of such a semiconductor electronic device is usually epitaxially fabricated on a heterogeneous substrate such as sapphire and silicon carbide, the channel layer is usually subject to strong tensile stress due to lattice mismatch or thermal mismatch, resulting in high density defects or even cracks. The existence of the defects leads to leakage in a direction perpendicular to the heterojunction interface, that is, vertical leakage.

SUMMARY

In view of this, the embodiments of the present application provide a semiconductor structure and a method for preparing the same, which solve the problems of vertical leakage in the semiconductor structure in the prior art.

A first aspect of the present application provides a semiconductor structure, including: a substrate; and a plurality of functional film layers stacked on the substrate. The plurality of functional film layers include a first semiconductor layer and a second semiconductor layer stacked with each other, the first semiconductor layer is arranged between the substrate and the second semiconductor layer, the first semiconductor layer includes a plurality of defect pits recessed toward the substrate, the plurality of defect pits are filled by the second semiconductor layer, and one side of the second semiconductor layer away from the first semiconductor layer is a plane.

In one embodiment, a thickness of the first semiconductor layer is less than or equal to 1 μm.

In one embodiment, the first semiconductor layer is a superlattice structure in which a plurality of film layers are stacked.

In one embodiment, the first semiconductor layer includes any one of a low-temperature GaN layer, an InGaN layer, and an InGaN/GaN superlattice structure layer; and the second semiconductor layer includes any one of a high-temperature GaN layer, a p-type GaN layer, an intrinsic GaN layer, an AlGaN layer, an InGaN layer, and an AlGaN/GaN superlattice structure layer.

In one embodiment, the first semiconductor layer includes doping elements.

In one embodiment, in a direction from the substrate to the plurality of functional film layers, a doping concentration of the doping elements is constant; or a doping concentration of the doping elements increases first and then decreases; or a doping concentration of the doping elements varies linearly; or a doping concentration of the doping elements changes stepwise.

In one embodiment, the first semiconductor layer is a superlattice structure with a plurality of film layers stacked, and the superlattice structure includes a plurality of repeating units; and a doping concentration of the doping elements in each of the repeating units increases first and then decreases in a direction from the substrate to the plurality of functional film layers.

In one embodiment, the doping elements includes carbon, a combination of carbon and silicon, or a combination of iron and carbon.

In one embodiment, a shape of the plurality of defect pits is V-shaped.

In one embodiment, the plurality of functional film layers further includes a third semiconductor layer, and the third semiconductor layer is arranged between the substrate and the first semiconductor layer, the third semiconductor layer is a III-V group compound layer.

In one embodiment, the semiconductor structure further includes a heterojunction structure; a gate structure on a gate region, a source structure on a source region, and a drain structure on a drain region. The heterojunction structure is arranged on the second semiconductor layer, the heterojunction structure includes the gate region, the source region, and the drain region, and the source region and the drain region are arranged on both sides of the gate region respectively.

In one embodiment, the gate structure includes a P-type semiconductor layer and a gate metal, and the P-type semiconductor layer is arranged between the heterojunction structure and the gate metal.

In one embodiment, the semiconductor structure further includes: a heterojunction structure arranged on the second semiconductor layer; and a first electrode and a second electrode arranged on the heterojunction structure. The first electrode is in ohmic contact with the heterojunction structure, and the second electrode is in Schottky contact with the heterojunction structure.

A second aspect of the present application provides a method for preparing a semiconductor structure, including: providing a preset substrate including a substrate; forming a first semiconductor layer, having a plurality of defect pits recessed toward the substrate, on the preset substrate under a condition with a first temperature; and forming a second semiconductor layer on the first semiconductor layer under a condition with a second temperature higher than the first temperature, so that the second semiconductor layer fills the plurality of defect pits, and one side of the second semiconductor layer away from the first semiconductor layer is a plane.

In one embodiment, the providing a preset substrate includes: forming a buffer layer on the substrate, and forming a third semiconductor layer, being a III-V group compound layer, on the buffer layer.

In one embodiment, the method further includes: forming a heterojunction structure on the second semiconductor layer; and forming a gate structure, a source structure and a drain structure on the heterojunction structure, where the source structure and the drain structure are respectively arranged on both sides of the gate structure.

In one embodiment, the forming a gate structure on the heterojunction structure includes: forming a P-type semiconductor layer on the heterojunction structure, and forming a gate metal on the P-type semiconductor layer.

In one embodiment, the first temperature is less than or equal to 1000° C.

In one embodiment, the first semiconductor layer is a superlattice structure in which a plurality of film layers are stacked, and the first temperature is less than or equal to 850° C.

Dislocations are channels for vertical leakage of devices. According to the semiconductor structure and the method for preparing the same provided in the present application, the dislocations in the semiconductor film layer are intentionally bent to form the first semiconductor layer with the plurality of defect pits. On the basis, the second semiconductor layer that fills the plurality of defect pits is further arranged to form a flat surface, and the semiconductor device epitaxial fabricated on the basis of this structure may effectively reduce dislocations and reduce vertical leakage.

DETAILED DESCRIPTION OF THE EMBODIMENTS

As mentioned in the background, as for a conventional semiconductor structure, when the heterojunction structure is formed on the substrate, the defects are likely to occur in arrangement of atoms, which leads to the electric leakage in the direction perpendicular to the heterojunction interface. The inventors found that the defects in the semiconductor film layer is bent to form a first semiconductor layer with a plurality of defect pits, and a second semiconductor material is further grown on the first semiconductor layer to fill the plurality of defect pits, thereby forming a flat surface. A semiconductor device epitaxial fabricated on the basis of this structure may effectively reduce vertical leakage.

The following will clearly describe the technical solutions in the embodiments of the application with reference to the drawings in the embodiments of the application. Apparently, the described embodiments are only some, not all embodiments of the application. Based on the embodiments in this application, all other embodiments obtained by persons of ordinary skill in the art without making creative efforts, belong to the protection scope of the present application.

Figure 1:
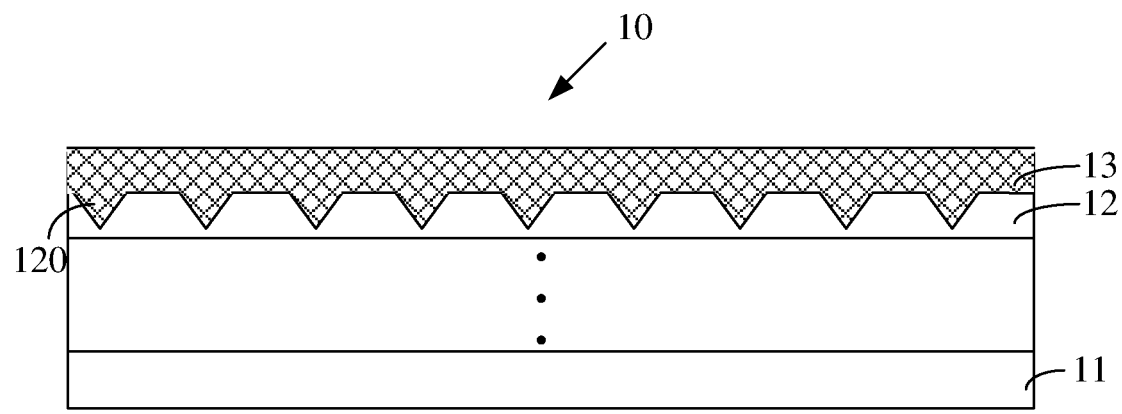
FIG. 1 is a schematic diagram of a semiconductor structure according to a first embodiment of the present application.

FIG. 1 is a schematic diagram of a semiconductor structure according to a first embodiment of the present application. The semiconductor structure may be a semiconductor device with a heterojunction structure, such as a field effect transistor, or other types of triodes, diodes, and the like. As shown in FIG. 1, the semiconductor structure 10 includes a substrate 11 and a plurality of functional film layers stacked on substrate 11. The plurality of functional film layers include a first semiconductor layer 12 and a second semiconductor layer 13 stacked with each other, the first semiconductor layer 12 is arranged between the substrate 11 and the second semiconductor layer 13, the first semiconductor layer 12 includes a plurality of defect pits 120 recessed toward the substrate 11, the plurality of defect pits 120 are filled by the second semiconductor layer 13, and one side of the second semiconductor layer 13 away from the first semiconductor layer 12 is a plane.

The substrate 11 is a basic component of the semiconductor structure 10, and is used to support each functional film layer of the semiconductor structure 10. Therefore, the substrate 11 needs to have a certain supporting strength. For example, a material of the substrate 11 is silicon, silicon carbide, aluminum oxide, or the like.

The plurality of defect pits 120 in the first semiconductor layer 12 is formed during the growth of the first semiconductor layer 12, and the second semiconductor layer 13 fills the plurality of defect pits 120 by growing on the first semiconductor layer 12, and grows into a plane on the side away from the first semiconductor layer 12. Specifically, under a low-temperature growth environment, the defects caused by the lattice mismatch and thermal expansion coefficient mismatch of the heterogeneous substrate extend into the first semiconductor layer 12 and change an extension direction in the first semiconductor layer 12, so that the plurality of defect pits 120 are formed on the side of the first semiconductor layer 12 away from the substrate 11. Under a high-temperature growth environment, the second semiconductor layer 13 continues to epitaxially grow on a surface of the first semiconductor layer 12 away from the substrate 11, and the defects cannot extend into the second semiconductor layer 13 due to the change of the extension direction, that is, the second semiconductor layer 13 is a high-quality semiconductor layer without defects.

In one embodiment, a GaN layer is grown at a condition with a temperature less than or equal to 1000° C., such as 900° C., 850° C. or 800° C., to obtain the first semiconductor layer 12 with the plurality of defect pits 120, which are V-shaped.

In one embodiment, the first semiconductor layer 12 has a thickness less than or equal to 1 μm. Preferably, the thickness of the first semiconductor layer 12 is less than or equal to 200 nm, so as to ensure that the defects on the side of the first semiconductor layer 12 away from the substrate 11 can be completely bent, while avoiding excessive thickness of the first semiconductor layer 12, resulting in high device cost.

Materials of the first semiconductor layer 12 and the second semiconductor layer 13 may be the same or different. In one embodiment, the first semiconductor material layer 12 is a low-temperature GaN layer, and the second semiconductor layer 13 is a high-temperature GaN layer. The low-temperature GaN layer and high-temperature GaN layer mentioned here are two relative concepts, that is, the materials of the first semiconductor layer 12 and the second semiconductor layer 13 are both GaN, and a growth temperature of the first semiconductor layer 12 is lower than that of the second semiconductor layer 13. The first semiconductor material layer 12 may also be an InGaN layer or an InGaN/GaN superlattice structure layer. The second semiconductor layer 13 may also be any one of a p-type GaN layer, an intrinsic GaN layer, an AlGaN layer, an InGaN layer, and an AlGaN/GaN superlattice structure layer.

In one embodiment, the first semiconductor layer includes doping elements. A material and doping concentration of the doping elements may be arranged reasonably according to the actual situation.

In one embodiment, the doping elements may be carbon, a combination of carbon and silicon, or a combination of iron and carbon. Thus, leakage current of the semiconductor device may be reduced, pinch-off characteristics is improved, and current collapse of the device is avoided. In addition, by controlling the doping concentration of the doping elements, balance of the leakage current of the device in dynamic characteristics may be ensured.

In one embodiment, in a direction from the substrate to the plurality of functional film layers, the doping concentration of the doping elements is constant; or the doping concentration of the doping elements increases first and then decreases; or the doping concentration of the doping elements varies linearly; or the doping concentration of the doping elements changes stepwise.

In one embodiment, the first semiconductor layer is a superlattice structure with a plurality of film layers stacked, and the superlattice structure includes a plurality of repeating units. In a direction from the substrate to the plurality of functional film layers, a doping concentration of the doping elements in each of the repeating units increases first and then decreases.

According to the semiconductor structure provided in this embodiment, by arranging the first semiconductor layer 12 with the plurality of defect pits, the extended defects are intentionally bent, so that the defects cannot extend into the second semiconductor layer 13, ensuring that the second semiconductor layer 13 and subsequent other semiconductor layers formed on the second semiconductor layer 13 are high-quality semiconductor layers without defects, which effectively reduce the vertical leakage in the semiconductor structure.

Figure 2:
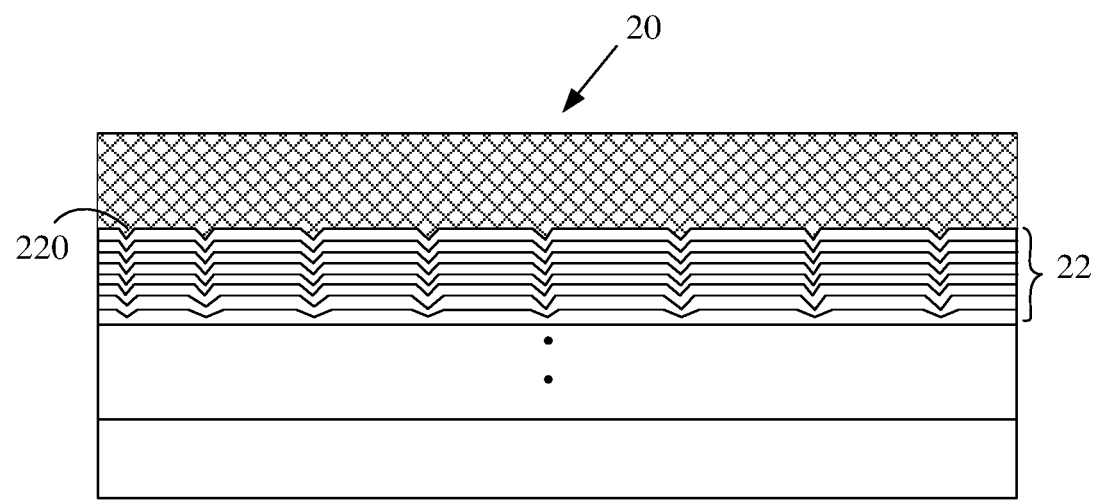
FIG. 2 is a schematic diagram of a semiconductor structure according to a second embodiment of the present application.

FIG. 2 is a schematic diagram of a semiconductor structure according to a second embodiment of the present application. As shown in FIG. 2, the difference between the semiconductor structure 20 and the semiconductor structure 10 shown in FIG. 1 is that in this embodiment, the first semiconductor layer 22 is a superlattice structure with a plurality of film layers stacked. For example, the superlattice structure is an InGaN/GaN superlattice structure. The number of film layers in the superlattice structure may be reasonably arranged according to actual needs.

In one embodiment, a thickness of a single film layer in the superlattice structure is about 20 nm.

In one embodiment, a growth temperature of the superlattice structure is greater than or equal to 750° C. and less than or equal to 850° C. to form the plurality of defect pits 220.

According to the semiconductor structure provided in this embodiment, the first semiconductor layer 22 adopts the superlattice structure, which may accelerate the opportunity to start forming the plurality of defect pits.

Figure 3:
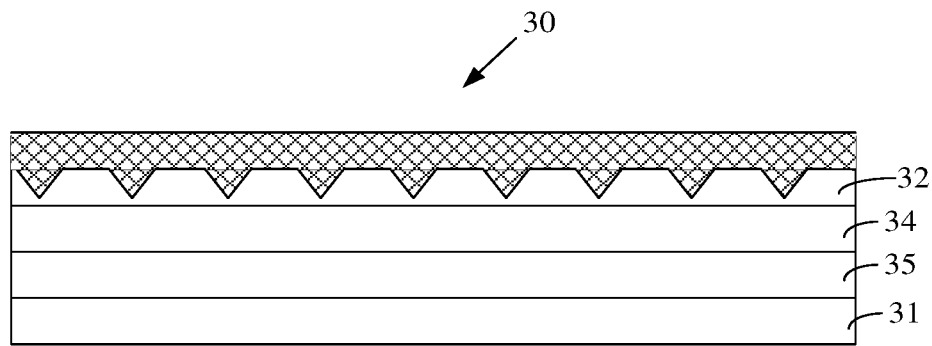
FIG. 3 is a schematic diagram of a semiconductor structure according to a third embodiment of the present application.

FIG. 3 is a schematic diagram of a semiconductor structure according to a third embodiment of the present application. As shown in FIG. 3, the difference between the semiconductor structure 30 and the semiconductor structure 10 shown in FIG. 1 or the semiconductor structure 20 shown in FIG. 2 is that the semiconductor structure 30 also includes a third semiconductor layer 34, and the third semiconductor layer 34 is arranged between the substrate 31 and the first semiconductor 32, and the third semiconductor layer 34 is a III-V group compound layer.

The third semiconductor layer 34 has at least two functions, one is to epitaxially develop a nitride structure, and the other is to transfer the defects. In one embodiment, a material of the third semiconductor layer 34 is the same as that of the first semiconductor layer 32, such as an intrinsic GaN layer.

In one embodiment, as shown in FIG. 3, the semiconductor structure 30 further includes a buffer layer 35 between the third semiconductor layer 34 and the substrate 31. A function of the buffer layer 35 is to avoid that the third semiconductor layer 34 cannot be formed directly on the substrate 31, and to preliminarily reduce the defects and improve crystal quality of epitaxial layers. A material of the buffer layer 35 includes at least any one of AlGaN, GaN and AlN.

Figure 4:
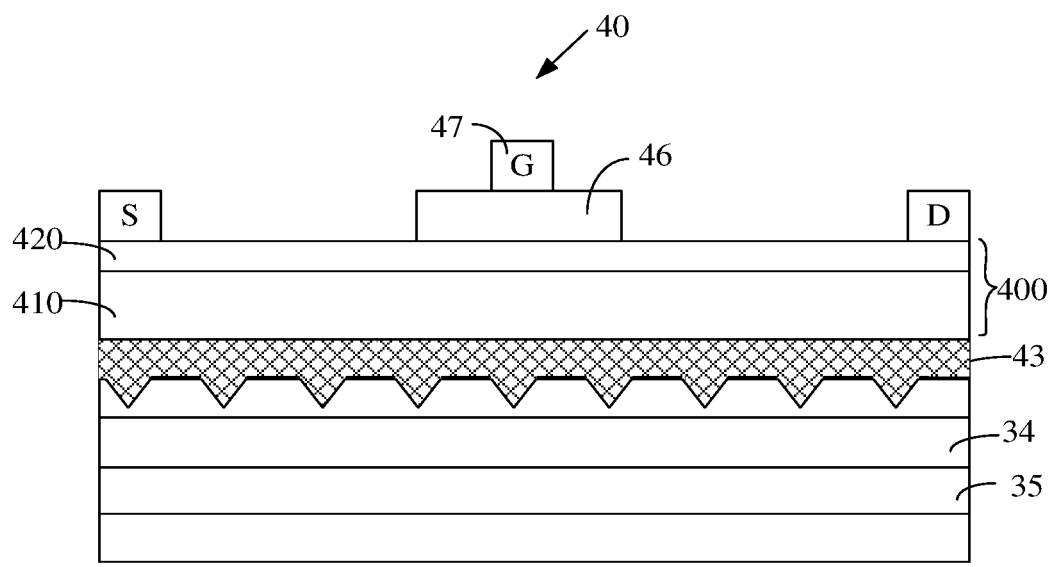
FIG. 4 is a schematic diagram of a semiconductor structure according to a fourth embodiment of the present application.

FIG. 4 is a schematic diagram of a semiconductor structure according to a fourth embodiment of the present application. As shown in FIG. 4, the semiconductor structure 40 is a field effect transistor. In this case, the difference between semiconductor structure 40 and the semiconductor structure 10 shown in FIG. 1, semiconductor structure 20 shown in FIG. 2, or semiconductor structure 30 shown in FIG. 3. lies in that the semiconductor structure 40 further includes a heterojunction structure 400. The heterojunction structure 400 includes a gate region, a source region and a drain region, and the source region and the drain region are respectively arranged on both sides of the gate region. The heterojunction structure 400 includes a channel layer 410 and a barrier layer 420 stacked on the second semiconductor layer 43 in sequence. In one embodiment, a material of the channel layer 410 is the same as that of the second semiconductor layer 43. For example, the channel layer 410 is a GaN channel layer. In one example, the barrier layer 420 is an AlGaN barrier layer. The semiconductor structure 40 also includes a gate structure arranged in the gate region, a source structure arranged in the source region, and a drain structure arranged in the drain region. The gate structure includes a P-type semiconductor layer 46 and a gate 47, and the P-type semiconductor layer 46 is arranged between the heterojunction structure 400 and the gate 47.

Figure 5:
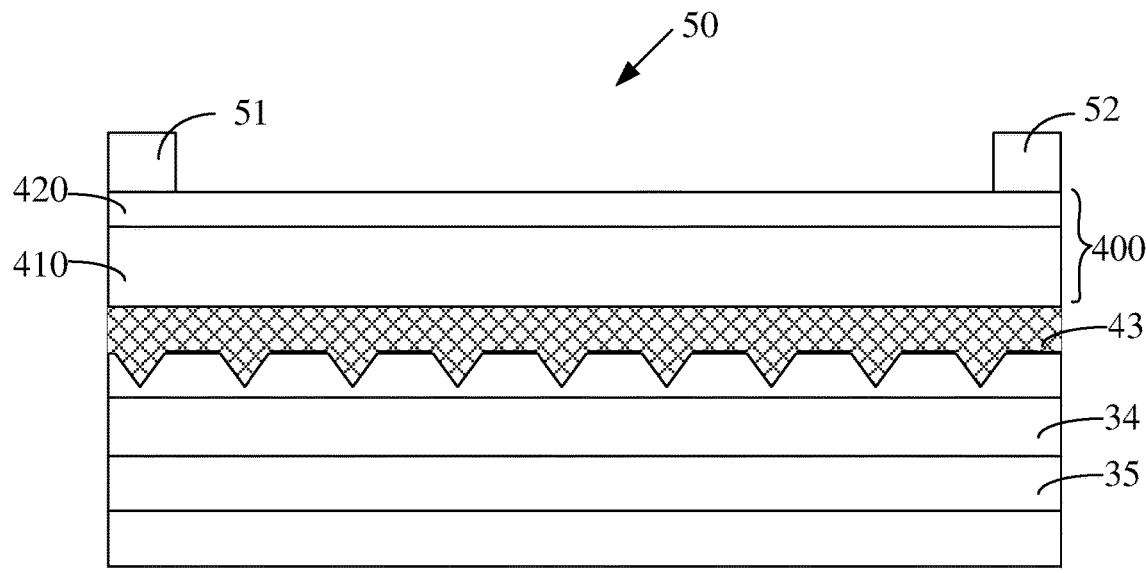
FIG. 5 is a schematic diagram of a semiconductor structure according to a fifth embodiment of the present application.

FIG. 5 is a schematic diagram of a semiconductor structure according to a fifth embodiment of the present application. As shown in FIG. 5, the semiconductor structure 50 is a Schottky diode. In this case, the difference between semiconductor structure 50 and semiconductor structure 40 shown in FIG. 4 is that the semiconductor structure 50 includes a first electrode 51 and a second electrode 52 arranged on the heterojunction structure 400. The first electrode 51 is in Ohmic contact with the heterojunction structure 400, and the second electrode 52 is in Schottky contact with the heterojunction structure 400.

Figure 6:
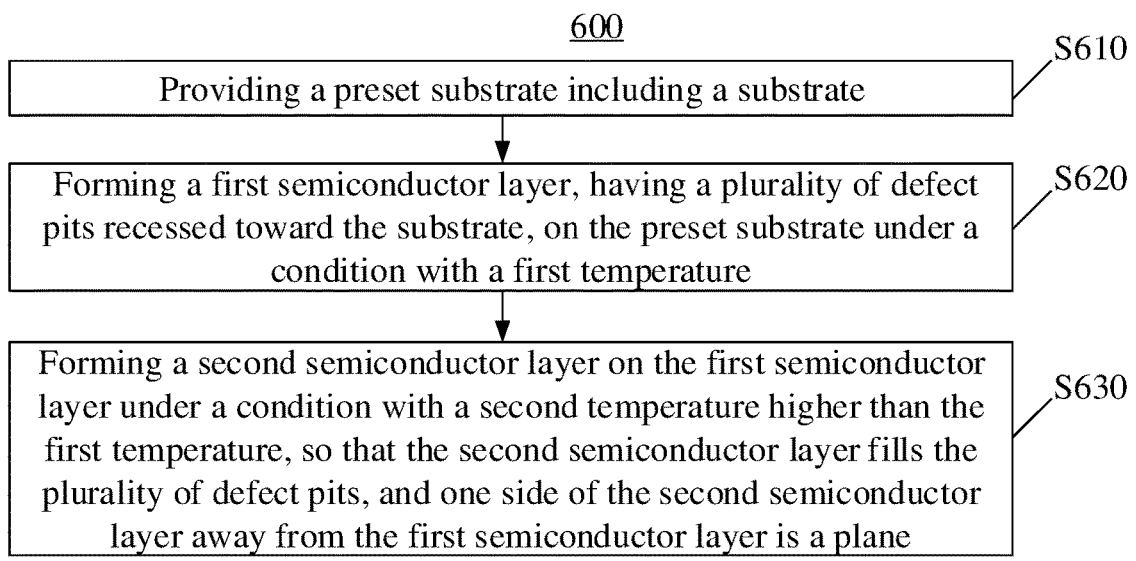
FIG. 6 is a flow chart of a method for preparing a semiconductor structure according to a first embodiment of the present application.

FIG. 6 is a flow chart of a method for preparing a semiconductor structure according to a first embodiment of the present application. As shown in FIG. 6, the method 600 includes:

S610, providing a preset substrate including a substrate. For example, a material of the substrate is silicon, silicon carbide, aluminum oxide, or the like.

In one embodiment, the S610 includes: forming a buffer layer on the substrate, and forming a third semiconductor layer, being a III-V group compound layer, on the buffer layer.

The third semiconductor layer has at least two functions, one is to epitaxially develop a nitride structure, and the other is to transfer defects. In one embodiment, a material of the third semiconductor layer is the same as that of a first semiconductor layer, for example, an intrinsic GaN layer.

A function of the buffer layer is to avoid that the third semiconductor layer cannot be formed directly on the substrate, and to preliminarily reduce the defects and improve crystal quality of epitaxial layers. A material of the buffer layer includes at least any one of AlGaN, GaN and AlN.

S620, forming a first semiconductor layer, having a plurality of defect pits recessed toward the substrate, on the preset substrate under a condition with a first temperature.

For example, under the condition with temperature less than or equal to 1000° C., a GaN layer is grown on the preset substrate to obtain the first semiconductor layer with the plurality of defect pit, which are V-shaped.

In one embodiment, a thickness of the first semiconductor layer is less than or equal to 1 μm. Preferably, the thickness of the first semiconductor layer is less than or equal to 200 nm, so as to ensure that the defects on a side of the first semiconductor layer away from the substrate is completely bent, while avoiding excessive thickness of the first semiconductor layer, resulting in high device cost.

S630, forming a second semiconductor layer on the first semiconductor layer under a condition with a second temperature higher than the first temperature, so that the second semiconductor layer fills the plurality of defect pits, and one side of the second semiconductor layer away from the first semiconductor layer is a plane.

For example, under the condition with temperature higher than 1000° C., the second semiconductor layer is grown on the first semiconductor layer, and the second semiconductor layer fills the plurality of defect pits and grows flat to form the plane on a side away from the first semiconductor layer. Materials of the first semiconductor layer and the second semiconductor layer may be the same or different. The first semiconductor layer may be a GaN layer, an InGaN layer or an InGaN/GaN superlattice structure layer. The second semiconductor layer may be any one of a GaN layer, a p-type GaN layer, an intrinsic GaN layer, an AlGaN layer, an InGaN layer, and an AlGaN/GaN superlattice structure layer.

In one embodiment, the first semiconductor layer is formed as a superlattice structure with a plurality of film layers stacked, and the first temperature is less than or equal to 850° C. In one embodiment, a thickness of a single film layer in the superlattice structure is about 20 nm. According to the semiconductor structure provided in this embodiment, the first semiconductor layer adopts the superlattice structure, which may accelerate the opportunity to start forming the plurality of defect pits.

Figure 7:
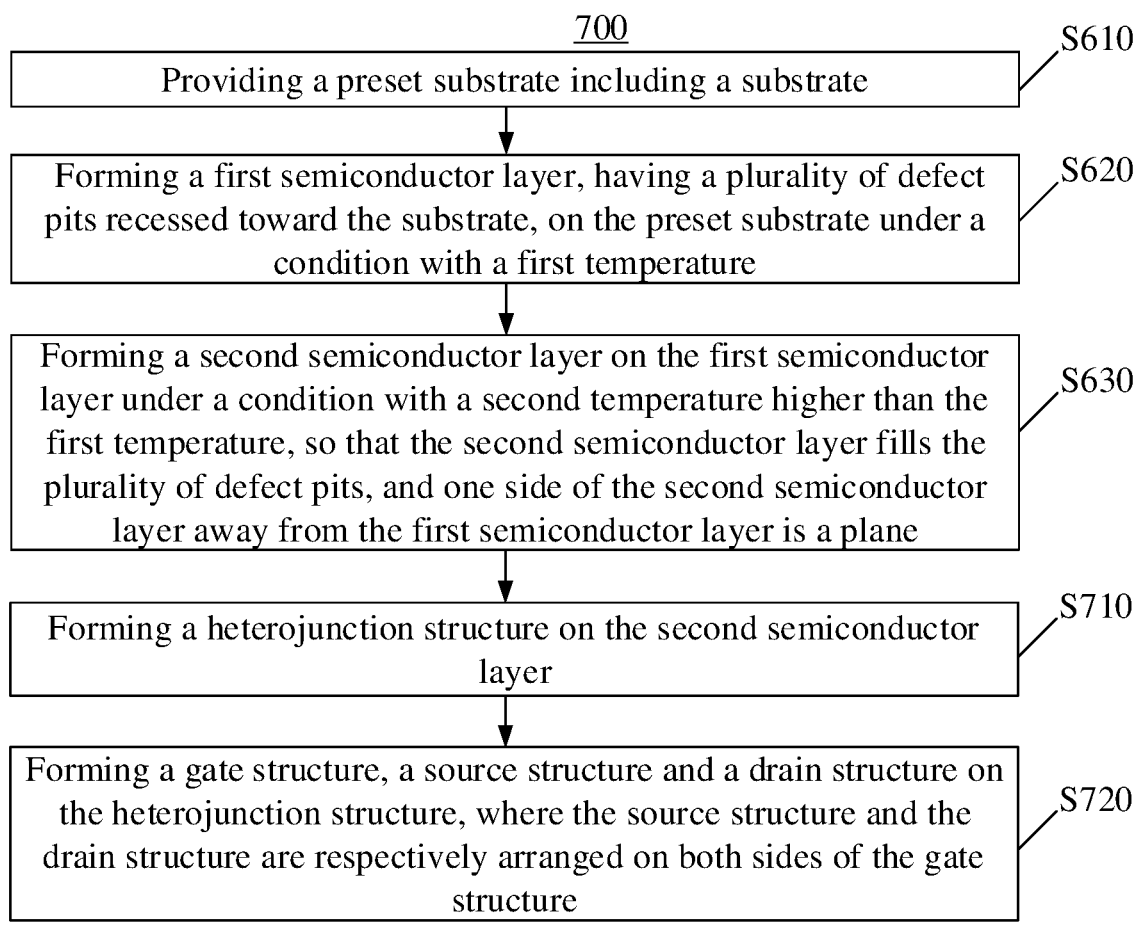
FIG. 7 is a flow chart of a method for preparing a semiconductor structure according to a second embodiment of the present application.

FIG. 7 is a flow chart of a method for preparing a semiconductor structure according to a second embodiment of the present application. As shown in FIG. 7, the method 700 is based on the method 600 shown in FIG. 6, further including:

S710, forming a heterojunction structure on the second semiconductor layer.

S720, forming a gate structure, a source structure and a drain structure on the heterojunction structure, where the source structure and the drain structure are respectively arranged on both sides of the gate structure.

In one embodiment, the forming a gate structure on the heterojunction structure includes: forming a P-type semiconductor layer on the heterojunction structure, and forming a gate metal on the P-type semiconductor layer.

The method for preparing the semiconductor structure provided in any embodiment of the present application may be used to prepare the semiconductor structure provided in any embodiment of the present application. For technical details not described in the preparation method embodiments, the semiconductor structure embodiments are referred, which are not repeated here.

The foregoing description has been presented for purposes of illustration and description. Furthermore, this description is not intended to limit the embodiments of the application to the forms disclosed herein. Although a number of examplary aspects and embodiments have been discussed above, those skilled in the art will recognize certain variations, modifications, changes, additions and sub-combinations thereof.

What is claimed is:

1. A semiconductor structure, comprising:
   a substrate; and
   a plurality of functional film layers stacked on the substrate,
   wherein the plurality of functional film layers comprise a first semiconductor layer and a second semiconductor layer stacked with each other, the first semiconductor layer is arranged between the substrate and the second semiconductor layer, the first semiconductor layer comprises a plurality of defect pits recessed toward the substrate, the plurality of defect pits are filled by the second semiconductor layer, and one side of the second semiconductor layer away from the first semiconductor layer is a plane; and
   the first semiconductor layer comprises doping elements, the first semiconductor layer is a superlattice structure with a plurality of film layers stacked, and the superlattice structure comprises a plurality of repeating units; and a doping concentration of the doping elements in each of the repeating units increases first and then decreases in a direction from the substrate to the plurality of functional film layers.

2. The semiconductor structure according to claim 1, wherein a thickness of the first semiconductor layer is less than or equal to 1 um.

3. The semiconductor structure according to claim 1, wherein the first semiconductor layer comprises any one of a low-temperature GaN layer, an InGaN layer, and an InGaN/GaN superlattice structure layer; and
   the second semiconductor layer comprises any one of a high-temperature GaN layer, a p-type GaN layer, an intrinsic GaN layer, an AlGaN layer, an InGaN layer, and an AlGaN/GaN superlattice structure layer.

4. The semiconductor structure according to claim 1, wherein in a direction from the substrate to the plurality of functional film layers,
   a doping concentration of the doping elements is constant; or
   a doping concentration of the doping elements increases first and then decreases; or
   a doping concentration of the doping elements varies linearly; or
   a doping concentration of the doping elements changes stepwise.

5. The semiconductor structure according to claim 1, wherein the doping elements comprise carbon, a combination of carbon and silicon, or a combination of iron and carbon.

6. The semiconductor structure according to claim 1, wherein a shape of the plurality of defect pits is V-shaped.

7. The semiconductor structure according to claim 1, wherein the plurality of functional film layers further comprises a third semiconductor layer, and the third semiconductor layer is arranged between the substrate and the first semiconductor layer, the third semiconductor layer is a III-V group compound layer.

8. The semiconductor structure according to claim 1, further comprising:
   a heterojunction structure, the heterojunction structure being arranged on the second semiconductor layer, the heterojunction structure comprising a gate region, a source region, and a drain region, and the source region and the drain region being arranged on both sides of the gate region respectively;
   a gate structure on the gate region;
   a source structure on the source region; and
   a drain structure on the drain region.

9. The semiconductor structure according to claim 8, wherein the gate structure comprises a P-type semiconductor layer and a gate metal, and the P-type semiconductor layer is arranged between the heterojunction structure and the gate metal.

10. The semiconductor structure according to claim 1, further comprising:
    a heterojunction structure arranged on the second semiconductor layer; and
    a first electrode and a second electrode arranged on the heterojunction structure, the first electrode being in ohmic contact with the heterojunction structure, and the second electrode being in Schottky contact with the heterojunction structure.

11. A method for preparing a semiconductor structure, comprising:
    providing a preset substrate comprising a substrate;
    forming a first semiconductor layer, having a plurality of defect pits recessed toward the substrate, on the preset substrate under a condition with a first temperature; and
    forming a second semiconductor layer on the first semiconductor layer under condition with a second temperature higher than the first temperature, so that the second semiconductor layer fills the plurality of defect pits, and one side of the second semiconductor layer away from the first semiconductor layer is a plane, wherein the first semiconductor layer comprises doping elements, the first semiconductor layer is a superlattice structure with a plurality of film layers stacked, and the superlattice structure comprises a plurality of repeating units; and a doping concentration of the doping elements in each of the repeating units increases first and then decreases in a direction from the substrate to the plurality of functional film layers.

12. The method according to claim 11, wherein the providing a preset substrate comprises:
    forming a buffer layer on the substrate, and forming a third semiconductor layer on the buffer layer, wherein the third semiconductor layer is a III-V group compound layer.

13. The method according to claim 11, further comprising:
    forming a heterojunction structure on the second semiconductor layer; and
    forming a gate structure, a source structure and a drain structure on the heterojunction structure, wherein the source structure and the drain structure are respectively arranged on both sides of the gate structure.

14. The method according to claim 13, wherein the forming a gate structure on the heterojunction structure comprises:
    forming a P-type semiconductor layer on the heterojunction structure, and forming a gate metal on the P-type semiconductor layer.

15. The method according to claim 11, wherein the first temperature is less than or equal to 1000° C.

16. The method according to claim 11, wherein the first the first temperature is less than or equal to 850° C.

* * * * *